(12) United States Patent
Mizoguchi et al.

(10) Patent No.: US 12,506,028 B2
(45) Date of Patent: Dec. 23, 2025

(54) MEMBER FOR SEMICONDUCTOR MANUFACTURING APPARATUS

(71) Applicant: NGK INSULATORS, LTD., Nagoya (JP)

(72) Inventors: Tomohisa Mizoguchi, Ichinomiya (JP); Keita Yamana, Nagoya (JP); Kazuhiro Nobori, Handa (JP); Kentaro Kimura, Nagoya (JP); Yoshinobu Goto, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 19/276,264

(22) Filed: Jul. 22, 2025

(65) Prior Publication Data

US 2025/0364307 A1    Nov. 27, 2025

Related U.S. Application Data

(63) Continuation of application No. PCT/JP2025/001940, filed on Jan. 22, 2025.

(30) Foreign Application Priority Data

May 27, 2024   (JP) ................. 2024-085826

(51) Int. Cl.
*H01T 23/00*  (2006.01)
*H01L 21/683*  (2006.01)
*H01L 21/687*  (2006.01)

(52) U.S. Cl.
CPC .... *H01L 21/68757* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 7,361,230 B2 * | 4/2008 | Natsuhara | H01L 21/68714 118/724 |
| 2007/0173185 A1 * | 7/2007 | Natsuhara | H01L 21/68735 451/285 |

(Continued)

FOREIGN PATENT DOCUMENTS

| | | |
|---|---|---|
| JP | 2003-223972 A | 8/2003 |
| JP | 2006-222008 A | 8/2006 |

(Continued)

OTHER PUBLICATIONS

International Search Report and Written Opinion (Application No. PCT/JP2025/001940) dated Apr. 8, 2025 (with English translation) (15 pages).

*Primary Examiner* — Stephen W Jackson
(74) *Attorney, Agent, or Firm* — BURR PATENT LAW, PLLC

(57) ABSTRACT

A member for a semiconductor manufacturing apparatus includes a ceramic base material and a conductor. The conductor is arranged in the ceramic base material. The ceramic base material contains a ceramic material having a thermal expansion coefficient of from $2.0 \times 10^{-6}/°$ C. to $10.0 \times 10^{-6}/°$ C. and spinel. The conductor includes a surface layer containing spinel and a skeleton positioned inside the surface layer.

10 Claims, 11 Drawing Sheets

(56) References Cited

U.S. PATENT DOCUMENTS

| | | | |
|---|---|---|---|
| 2009/0159007 A1 | 6/2009 | Morooka | |
| 2009/0283034 A1* | 11/2009 | Natsuhara | H01L 21/68757 118/500 |
| 2011/0063771 A1* | 3/2011 | Nishioka | H01L 21/6833 361/234 |
| 2013/0229746 A1 | 9/2013 | Aikawa et al. | |
| 2014/0079946 A1* | 3/2014 | Jindo | H01L 21/6833 156/276 |

FOREIGN PATENT DOCUMENTS

| | | |
|---|---|---|
| JP | 5032444 B2 | 9/2012 |
| WO | 2012/056915 A1 | 5/2012 |

\* cited by examiner

MEMBER FOR SEMICONDUCTOR MANUFACTURING APPARATUS

CROSS-REFERENCE TO RELATED APPLICATIONS

This application is a continuation under 35 U.S.C. 120 of International Application PCT/JP2025/001940 having the International Filing Date of 22 Jan. 2025 and having the benefit of the earlier filing date of Japanese Application No. 2024-085826 filed on 27 May 2024. Each of the identified applications is fully incorporated herein by reference.

BACKGROUND OF THE INVENTION

1. Field of the Invention

The present disclosure relates to a member for a semiconductor manufacturing apparatus.

2. Description of the Related Art

A semiconductor manufacturing apparatus for manufacturing a semiconductor device has heretofore included various members in accordance with its function. A member for a semiconductor manufacturing apparatus, including: a ceramic base material; and a conductor arranged in the ceramic base material may be used for such semiconductor manufacturing apparatus.

As such member for a semiconductor manufacturing apparatus, for example, there is a proposal of a substrate holder including: a ceramic base material produced from a ceramic raw material powder containing aluminum nitride and magnesium oxide; and a conductor produced from a conductive paste containing tungsten carbide and aluminum oxide (see Patent Literature 1).

CITATION LIST

Patent Literature

[PTL 1] JP 5032444 B2

SUMMARY OF THE INVENTION

However, in the member for a semiconductor manufacturing apparatus described in Patent Literature 1, a local variation in electrical conductivity (hereinafter referred to as "conductivity variation") may occur in the conductor, and a desired function may not be sufficiently exhibited.

A primary object of the present disclosure is to provide a member for a semiconductor manufacturing apparatus, the member including a conductor excellent in uniformity of an electrical conductivity.

[1] A member for a semiconductor manufacturing apparatus according to an embodiment of the present disclosure includes a ceramic base material and a conductor. The conductor is arranged in the ceramic base material. The ceramic base material contains a ceramic material having a thermal expansion coefficient of from $2.0 \times 10^{-6}/°$ C. to $10.0 \times 10^{-6}/°$ C. and spinel. The conductor includes a surface layer containing spinel and a skeleton positioned inside the surface layer.

[2] In the member for a semiconductor manufacturing apparatus according to the above-mentioned item [1], the skeleton may contain tungsten carbide and titanium nitride.

[3] In the member for a semiconductor manufacturing apparatus according to the above-mentioned item [2], a content ratio of tungsten carbide in the skeleton may be from 50 wt % to 99 wt %, and a content ratio of titanium nitride in the skeleton may be from 1 wt % to 50 wt %.

[4] In the member for a semiconductor manufacturing apparatus according to the above-mentioned item [1], the skeleton may contain molybdenum.

[5] In the member for a semiconductor manufacturing apparatus according to any one of the above-mentioned items [1] to [4], in the following line analysis with an electron probe microanalyzer in a cross section, which is obtained by cutting the ceramic base material having arranged therein the conductor in a thickness direction, an average value of Mg intensities in the surface layer may be 3 times or more as large as an average value of Mg intensities in the skeleton.

(Line Analysis)

The ceramic base material having arranged therein the conductor is cut in the thickness direction to form the cross section including the conductor. In the cross section, three measurement lines extending in the thickness direction and passing through the conductor are set at a distance from each other in a direction perpendicular to the thickness direction. An intensity of a characteristic X-ray of Mg in each of the three measurement lines is measured with an electron probe microanalyzer. A distance from a first end of each measurement line to a second end thereof and the intensity of the characteristic X-ray of Mg are plotted to generate a Mg characteristic X-ray spectrum for each measurement line. In the Mg characteristic X-ray spectrum, the maximum intensity of a peak positioned at an interface between the ceramic base material and the conductor is defined as a Mg intensity in the surface layer, and the average value is calculated from the Mg intensities in the surface layer in the three measurement lines. In the Mg characteristic X-ray spectrum, the maximum intensity of a peak positioned inside the conductor is defined as a Mg intensity in the skeleton, and the average value is calculated from the Mg intensities in the skeleton in the three measurement lines.

[6] In the member for a semiconductor manufacturing apparatus according to any one of the above-mentioned items [1] to [5], the ceramic base material may further contain titanium nitride.

[7] In the member for a semiconductor manufacturing apparatus according to the above-mentioned item [6], a content ratio of spinel in the ceramic base material may be from 0.5 wt % to 55 wt %, and a content ratio of titanium nitride in the ceramic base material may be from 0.1 wt % to 1.0 wt %.

[8] In the member for a semiconductor manufacturing apparatus according to any one of the above-mentioned items [1] to [7], a dimension of the conductor in the thickness direction of the ceramic base material may be from 10 μm to 50 μm.

[9] In the member for a semiconductor manufacturing apparatus according to any one of the above-mentioned items [1] to [8], the conductor may be a conductor obtained by printing.

[10] The member for a semiconductor manufacturing apparatus according to any one of the above-mentioned items [1] to [9] may include, as the conductor, an electrode and/or a resistance heating element, and a terminal portion. The terminal portion is electrically connected to the electrode and/or the resistance heating element.

According to the embodiment of the present disclosure, the member for a semiconductor manufacturing apparatus, the member including a conductor excellent in uniformity of an electrical conductivity, can be achieved.

DESCRIPTION OF THE EMBODIMENTS

Figure 1:
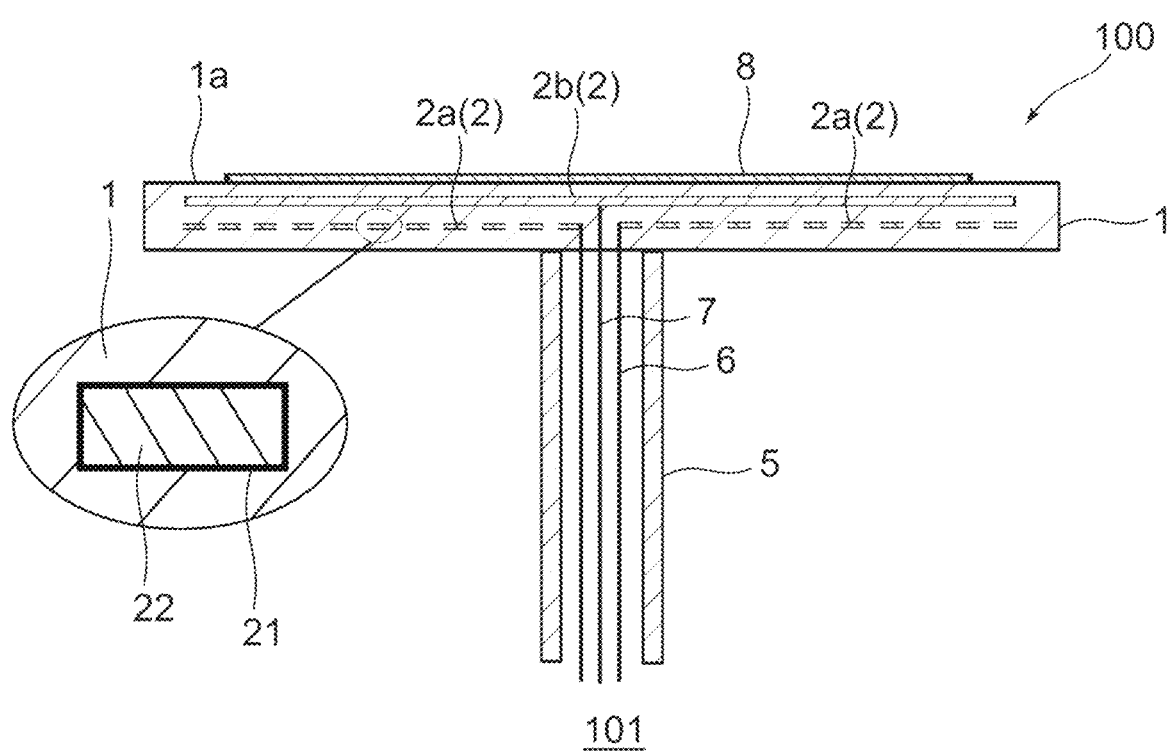
FIG. 1 is a schematic cross-sectional view of a heater serving as a member for a semiconductor manufacturing apparatus according to one embodiment of the present disclosure.

Embodiments of the present disclosure are described below. However, the present disclosure is not limited to these embodiments. In addition, for clearer illustration, some widths, thicknesses, shapes, and the like of respective portions may be schematically illustrated in the drawings in comparison to the embodiments. However, the widths, the thicknesses, the shapes, and the like are each merely an example, and do not limit the understanding of the present disclosure.

A. Outline of Member for Semiconductor Manufacturing Apparatus

FIG. 1 is a schematic cross-sectional view of a heater serving as a member for a semiconductor manufacturing apparatus according to one embodiment of the present disclosure.

A member 100 for a semiconductor manufacturing apparatus is typically a part of a semiconductor manufacturing apparatus for manufacturing a semiconductor device. The member 100 for a semiconductor manufacturing apparatus is a device that can be distributed alone and is industrially applicable.

As illustrated in FIG. 1, in one embodiment, the member 100 for a semiconductor manufacturing apparatus includes a ceramic base material 1 and a conductor 2. The ceramic base material 1 typically has a mounting surface 1a on which a semiconductor substrate 8 can be mounted. The mounting surface 1a is one surface of the ceramic base material 1 in its thickness direction. The ceramic base material 1 contains a ceramic material having a thermal expansion coefficient of from $2.0 \times 10^{-6}/°$ C. to $10.0 \times 10^{-6}/°$ C. and spinel. The conductor 2 is arranged in the ceramic base material 1. The conductor 2 includes a surface layer 21 and a skeleton 22. The surface layer 21 of the conductor 2 contains spinel. In other words, the surface layer 21 contains a spinel crystal phase. The skeleton 22 of the conductor 2 is positioned inside the surface layer 21. In other words, the skeleton 22 is positioned on the side of the surface layer 21 opposite to the ceramic base material 1.

The inventors of the present disclosure have found that, in the member for a semiconductor manufacturing apparatus including: a ceramic base material; and a conductor arranged in the ceramic base material, when spinel is formed and unevenly distributed inside the conductor, a conductivity variation occurs in the conductor. Accordingly, the inventors have made extensive investigations on a position at which spinel is present, and as a result, have found that when a surface layer containing spinel is formed in the conductor, the conductivity variation in the conductor can be reduced, and the uniformity of the electrical conductivity in the conductor can be improved.

More specifically, the surface layer containing spinel is positioned at an interface between the skeleton of the conductor and the ceramic base material, and hence the diffusion of Mg into the skeleton of the conductor can be suppressed, and the formation of spinel in the skeleton of the conductor can be suppressed. Accordingly, in the conductor, the electrical conductivity can be improved and the conductivity variation can be suppressed.

In addition, the surface layer containing spinel is positioned at the interface between the ceramic base material and the skeleton of the conductor, and hence adhesiveness between the ceramic base material and the skeleton of the conductor can be improved.

The surface layer 21 of the conductor 2 may be continuously arranged over the entire interface between the ceramic base material 1 and the skeleton 22 of the conductor 2, or may be partially arranged at the interface between the ceramic base material 1 and the skeleton 22 of the conductor 2.

In the illustrated example, the surface layer 21 is continuously arranged over the entire interface between the ceramic base material 1 and the skeleton 22, and surrounds the periphery of the conductor 2. According to such configuration, the diffusion of Mg into the skeleton of the conductor can be stably suppressed.

The thickness of the surface layer 21 is, for example, from 0.5 μm to 10 μm, preferably from 2.0 μm to 8.0 μm, more preferably from 2.0 μm to 6.0 μm. The thickness of the surface layer 21 is measured with, for example, an electron probe microanalyzer (EPMA)

The skeleton 22 of the conductor 2 is typically surrounded by the surface layer 21. The skeleton 22 of the conductor 2 is typically formed of a conductive material having a volume resistivity smaller than that of spinel.

Examples of such conductive material include: metal carbide compounds such as tungsten carbide (WC); metal nitride compounds such as titanium nitride (TiN); and transition metals, such as molybdenum (Mo), tantalum (Ta), tungsten (W), platinum (Pt), rhenium (Re), and hafnium (Hf). The conductive materials may be used alone or in combination thereof.

In one embodiment, the skeleton 22 of the conductor 2 is formed of tungsten carbide (WC) and titanium nitride (TiN). In other words, the skeleton 22 of the conductor 2 contains a WC crystal phase and a TiN crystal phase. When the skeleton of the conductor is formed of WC and TiN, a volume resistivity of the skeleton of the conductor can be stably made smaller than a volume resistivity of the surface layer containing spinel. As a result, leakage of a current that flows through the skeleton of the conductor into the ceramic base material can be sufficiently suppressed by the surface layer of the conductor. Thus, a voltage can be efficiently and uniformly applied to the entire conductor.

When the skeleton 22 of the conductor 2 is formed of WC and TiN, a content ratio of WC in the skeleton 22 of the conductor 2 is, for example, from 50.0 wt % to 99.0 wt %, preferably from 90.0 wt % to 99.0 wt %, more preferably from 93.0 wt % to 98.0 wt %, still more preferably 95.0 wt % to 97.0 wt %.

In addition, a content ratio of TiN in the skeleton 22 of the conductor 2 is, for example, from 1.0 wt % to 50.0 wt %, preferably from 1.0 wt % to 5.0 wt % in terms of oxide.

When the content ratio of WC and/or TiN in the skeleton of the conductor falls within such ranges, the volume resistivity of the skeleton of the conductor can be sufficiently made smaller than the volume resistivity of the surface layer.

The content ratio of each of the constituent elements in the conductor is measured in conformity with JIS-K0116 by, for example, inductively coupled plasma atomic emission spectroscopy (ICP-AES).

In addition, in another embodiment, the skeleton 22 of the conductor 2 is formed of molybdenum (Mo). In other words, the skeleton 22 of the conductor 2 contains a Mo crystal phase.

When the skeleton 22 of the conductor 2 is formed of Mo, a content ratio of Mo in the skeleton 22 of the conductor 2 is, for example, from 95.0 wt % to 99.9 wt %.

A content ratio of spinel in the skeleton 22 of the conductor 2 is typically smaller than a content ratio of spinel in the surface layer 21 of the conductor 2. The content ratios of spinel each correlate with a Mg intensity measured with an electron probe microanalyzer (EPMA).

A Mg concentration in each of the surface layer 21 and skeleton 22 of the conductor 2 is measured as, for example, a Mg intensity in the following line analysis with an electron probe microanalyzer (EPMA).

(Line Analysis)
(1) First, the ceramic base material 1 having arranged therein the conductor 2 is cut in the thickness direction to form a cross section including the conductor 2.
(2) Subsequently, in the cross section, a plurality of measurement lines extending in the thickness direction of the ceramic base material 1 and passing through the conductor 2 are set. The plurality of measurement lines are positioned at any appropriate distance from each other in a direction perpendicular to the thickness direction of the ceramic base material 1. The number of the measurement lines is typically three. Each of the plurality of measurement lines has a first end positioned between the mounting surface 1*a* of the ceramic base material 1 and the conductor 2, and a second end positioned on the side of the conductor 2 opposite to the first end.
(3) Then, an intensity of the characteristic X-ray of Mg in each of the plurality of measurement lines is measured with the EPMA. In addition, a distance from the first end of each measurement line to the second end thereof and the intensity of the characteristic X-ray of Mg are plotted on an X-axis indicating the distance from the first end of the measurement line to the second end thereof and a Y-axis indicating the intensity of the characteristic X-ray of Mg, respectively, to generate a Mg characteristic X-ray spectrum.
(4) After that, in each of the plurality of Mg characteristic X-ray spectra, the maximum intensity of a peak positioned at the interface between the ceramic base material 1 and the conductor 2 is extracted as a Mg intensity in the surface layer 21. The highest numerical value among the Mg intensities in the surface layer 21 extracted from the plurality of Mg characteristic X-ray spectra is defined as the maximum value of the Mg intensity in the surface layer 21.

In addition, in each of the plurality of Mg characteristic X-ray spectra, the maximum intensity of a peak positioned inside the conductor 2 is extracted as a Mg intensity in the skeleton 22. The highest numerical value among the Mg intensities in the skeleton 22 extracted from the plurality of Mg characteristic X-ray spectra is defined as the maximum value of the Mg intensity in the skeleton 22.

In the above-mentioned line analysis with the EPMA, the maximum value of the Mg intensity in the skeleton 22 of the conductor 2 is typically smaller than the maximum value of the Mg intensity in the surface layer 21 of the conductor 2.

In the above-mentioned line analysis with the EPMA, the maximum value of the Mg intensity in the skeleton 22 of the conductor 2 is, for example, 5,000 or less, preferably 3,000 or less, more preferably 2,000 or less. Meanwhile, in the above-mentioned line analysis with the EPMA, the maximum value of the Mg intensity in the skeleton 22 of the conductor 2 is, for example, 500 or more.

In the above-mentioned line analysis with the EPMA, the maximum value of the Mg intensity in the surface layer 21 of the conductor 2 is, for example, 3,000 or more, preferably 4,000 or more. Meanwhile, in the above-mentioned line analysis with the EPMA, the maximum value of the Mg intensity in the surface layer 21 of the conductor 2 is, for example, 20,000 or less.

When the maximum value of the Mg intensity in each of the surface layer and the skeleton in the conductor falls within such ranges, the electrical conductivity of the conductor can be further improved, and the conductivity variation in the conductor can be stably suppressed.

In the line analysis described above, an average value of a plurality of Mg intensities in the surface layer 21 is, for example, 2.5 times or more, preferably 3.0 times or more, more preferably 3.5 times or more as large as an average value of a plurality of Mg intensities in the skeleton 22.

When the ratio of the average value of the Mg intensities in the surface layer to the average value of the Mg intensities in the skeleton is such values, the electrical conductivity of the conductor can be still further improved, and the conductivity variation in the conductor can be more stably suppressed.

Meanwhile, the average value of the Mg intensities in the surface layer 21 is, for example, 13 times or less, or, for example, 12 times or less as large as the average value of the Mg intensities in the skeleton 22.

The thickness of such conductor 2 (dimension thereof in the thickness direction of the ceramic base material 1) is, for example, from 10 μm to 50 μm, preferably from 20 μm to 30 μm.

B. Details of Member for Semiconductor Manufacturing Apparatus

Details of each member of the member for a semiconductor manufacturing apparatus are described below.

B-1. Ceramic Base Material

The ceramic base material 1 may have any appropriate shape in accordance with an application of a heater for a semiconductor manufacturing apparatus. A typical example of the shape of the ceramic base material 1 is a plate shape. The ceramic base material 1 preferably has a disc shape. The thickness of the ceramic base material 1 is, for example, from 10 mm to 50 mm.

The ceramic base material 1 is typically formed of a composite sintered body containing a ceramic material having a thermal expansion coefficient of from $2.0\times10^{-6}$/°C. to $10.0\times10^{-6}$/°C. and spinel.

Examples of the ceramic material having a thermal expansion coefficient of from $2.0\times10^{-6}$/°C. to $10.0\times10^{-6}$/°C. include aluminum nitride (AlN) and alumina ($Al_2O_3$). Such ceramic materials may be used alone or in combination thereof.

The absolute value of the difference between the thermal expansion coefficients of the ceramic material and the conductive material for forming the conductor 2 is, for example, 0.3 ppm/°C. or less, preferably 0.2 ppm/°C. or less in the range of from 40°C. to 100°C. Meanwhile, the lower limit of the absolute value of the difference between the thermal expansion coefficients of the ceramic material and the conductive material is typically 0.03 ppm/°C. When the absolute value of the difference between the thermal expansion coefficients of the ceramic material and the conductive material falls within such ranges, breakage such as a crack can be sufficiently prevented from occurring in the ceramic base material in manufacturing the member for a semiconductor manufacturing apparatus.

In one embodiment, the ceramic base material 1 is formed of a composite sintered body containing aluminum nitride (AlN) and a spinel. In other words, the ceramic base material 1 contains an AlN crystal phase and a spinel crystal phase. The crystal phases in the ceramic base material are measured by, for example, X-ray diffraction (XRD) in conformity with JIS Z2201 and JIS K0114.

In one embodiment, the ceramic base material 1 has a polycrystalline structure containing a plurality of AlN crystal grains. Among the plurality of AlN crystal grains, AlN crystal grains adjacent to each other are typically bonded to each other.

The average grain diameter of the plurality of AlN crystal grains is, for example, from 1 μm to 5 μm, preferably from 1 μm to 3 μm.

A content ratio of AlN in the ceramic base material 1 is, for example, 50.0 wt % or more, preferably 55 wt % or more, more preferably 95.0 wt % or more, still more preferably 97.0 wt % or more, especially preferably 98.0 wt % or more. Meanwhile, the content ratio of AlN in the ceramic base material 1 is, for example, 99.8 wt % or less, preferably 99.5 wt % or less, more preferably 99.0 wt % or less.

When the content ratio of AlN in the ceramic base material falls within the above-mentioned ranges, a high thermal conductivity, high toughness, and high dielectric strength can be expressed.

The content ratio of each of the compositional elements in the ceramic base material is measured by, for example, inductively coupled plasma atomic emission spectroscopy (ICP-AES) in conformity with JIS K0116.

Typically, spinel is present at a grain boundary between AlN crystal grains, or is formed by a reaction between magnesium oxide and aluminum oxide at the grain boundary between the AlN crystal grains.

A content ratio of spinel in the ceramic base material 1 is, for example, 0.1 wt % or more, preferably 0.4 wt % or more, more preferably 0.5 wt % or more, still more preferably 0.8 wt % or more in terms of oxide. Meanwhile, the content ratio of spinel in the ceramic base material 1 is, for example, 55 wt % or less, preferably 50 wt % or less, more preferably 45 wt %, still more preferably 1.2 wt % or less in terms of oxide.

When the content ratio of spinel in the ceramic base material falls within such ranges, the volume resistivity of the ceramic base material in a high temperature region can be stably improved.

In one embodiment, the ceramic base material 1 further contains titanium nitride (TiN). In other words, the ceramic base material 1 contains a TiN crystal phase in addition to the AlN crystal phase and the spinel crystal phase. TiN is typically present at a grain boundary between AlN crystal grains.

When each of the ceramic base material 1 and the skeleton 22 of the conductor 2 contains TiN, a content ratio of TiN in the ceramic base material 1 is typically smaller than a content ratio of TiN in the skeleton 22 of the conductor 2.

The content ratio of TiN in the ceramic base material 1 is, for example, 0.01 wt % or more, preferably 0.1 wt % or more, more preferably 0.3 wt % or more in terms of oxide. Meanwhile, the content ratio of TiN in the ceramic base material 1 is, for example, 1.0 wt % or less, preferably 0.8 wt % or less in terms of oxide.

The content ratio of TiN in the ceramic base material preferably falls within such ranges because the formation of a conductive path in a grain boundary layer is suppressed, and hence the reduction in resistivity of the ceramic base material is suppressed.

The ceramic base material 1 may further contain another crystal phase in addition to the AlN crystal phase, the spinel crystal phase, and the TiN crystal phase. An example of the other crystal phase is α-aluminum oxide (α-alumina).

A content ratio of the other crystal phase in the ceramic base material 1 is, for example, 1.0 wt % or less. Meanwhile, the lower limit of the content ratio of the other crystal phase in the ceramic base material 1 is typically 0 wt %.

When the content ratio of the other crystal phase in the ceramic base material falls within such ranges, the volume resistivity of the ceramic base material in a high temperature region can be sufficiently secured.

Such ceramic base material 1 has a relatively high volume resistivity in a high temperature region.

The volume resistivity of the ceramic base material 1 at 600°C. is, for example, $1.0\times10^9$ Ω·cm or more, preferably $1.2\times10^9$ Ω·cm or more, more preferably $2.0\times10^9$ Ω·cm or more, still more preferably $5.0\times10^9$ Ω·cm or more, especially preferably $1.0\times10^{10}$ Ω·cm or more, particularly preferably $7.0\times10^{10}$ Ω·cm or more, most preferably $8.0\times10^{10}$ Ω·cm or more.

Meanwhile, the volume resistivity of the ceramic base material 1 at 600°C. is, for example, $1.0\times10^{12}$ Ω·cm or less, or for example, $1.5\times10^{11}$ Ω·cm or less.

The volume resistivity of the ceramic base material at 600°C. is measured in conformity with JIS C2141-1992, for example.

A thermal conductivity of the ceramic base material 1 at 600°C. is, for example, from 20 W/m·K to 50 W/m·K.

The thermal conductivity of the ceramic base material at 600°C. is measured in conformity with a flash method specified in JIS R1611:2010, for example.

An open porosity of the ceramic base material 1 is, for example, 1.0% or less. The open porosity of the ceramic base material is measured in conformity with JIS R1634, for example.

The relative density of the ceramic base material 1 is, for example, 99.0% or more, preferably 99.5% or more. Meanwhile, the upper limit of the relative density of the ceramic base material 1 is typically 100%. The relative density of a ceramic base material is measured in conformity with JIS R1634, for example.

B-2. Conductor

The conductor 2 has any appropriate function in accordance with an application of the member 100 for a semiconductor manufacturing apparatus. The number of elements of the conductor 2 to be arranged in the ceramic base material 1 is not particularly limited. A plurality of conductors 2 may be arranged in the ceramic base material 1. In this case, the plurality of conductors 2 may be positioned at a distance from each other in the thickness direction of the ceramic base material 1, or may be brought into contact with each other in the thickness direction of the ceramic base material 1.

Examples of the conductor 2 include: an electrode, such as an ESC electrode or a RF electrode; a resistance heating element; and a terminal portion.

In one embodiment, the member 100 for a semiconductor manufacturing apparatus includes a resistance heating element 2a as the conductor 2. The resistance heating element 2a is configured to generate heat when a voltage is applied thereto.

The resistance heating element 2a has any appropriate shape. Examples of the shape of the resistance heating element 2a include a coil shape, a zigzag shape, and a mesh shape.

As described above, the resistance heating element 2a includes the surface layer 21 containing spinel and the skeleton 22 containing a conductive material. The skeleton 22 of the resistance heating element 2a is preferably formed of WC and TiN or formed of Mo.

In one embodiment, the member 100 for a semiconductor manufacturing apparatus further includes an ESC electrode 2b as the conductor 2. In the illustrated example, the ESC electrode 2b is distant from the resistance heating element 2a in the thickness direction of the ceramic base material 1, and is positioned between the mounting surface 1a and the resistance heating element 2a.

When a DC voltage is applied to the ESC electrode 2b under a state in which the semiconductor substrate 8 is mounted on the mounting surface 1a, the ESC electrode 2b is charged with any one of positive charge and negative charge depending on the polarity of the applied DC voltage, and the other of the positive charge and the negative charge inherent in the semiconductor substrate 8 moves to the mounting surface 1a side of the semiconductor substrate 8. Thus, Johnson-Rahbek (JR) force is generated between the semiconductor substrate 8 and the ESC electrode 2b, and the semiconductor substrate 8 is chucked by the ceramic base material 1.

Although not illustrated in the drawing, the member 100 for a semiconductor manufacturing apparatus may include a plurality of ESC electrodes 2b.

The ESC electrode 2b may function as a radio-frequency electrode (that is, a RF electrode) for plasma treatment. That is, the ESC electrode 2b preferably functions as a RF/ESC electrode. Examples of the plasma treatment include film forming treatment and etching treatment.

When such plasma treatment is performed on the semiconductor substrate 8 on the mounting surface 1a, an upper electrode is arranged on the side of the semiconductor substrate 8 opposite to the ESC electrode 2b. When radio-frequency power is supplied to the ESC electrode 2b in this state, a processing gas can be excited to generate plasma in a space between the ceramic base material 1 and the upper electrode. The plasma generated in this manner is used for the plasma treatment on the semiconductor substrate 8.

The ESC electrode 2b may have any appropriate shape. The ESC electrode 2b typically has a plate shape. In one embodiment, the ESC electrode 2b has a shape similar to the outer shape of the ceramic base material 1 when viewed in the thickness direction of the ceramic base material 1. In the illustrated example, the center of the ESC electrode 2b and the center of the ceramic base material 1 are substantially aligned with each other when viewed in the thickness direction of the ceramic base material 1.

As described above, the ESC electrode 2b includes the surface layer 21 containing spinel and the skeleton 22 containing a conductive material. Preferred examples of the conductive material for forming the skeleton 22 of the ESC electrode 2b include a metal and an inorganic compound.

Specific examples of the metal include molybdenum, niobium, tantalum, and an alloy thereof.

A specific example of the inorganic compound is molybdenum carbide.

Those conductive materials may be used alone or in combination thereof.

C. Method of Manufacturing Member for Semiconductor Manufacturing Apparatus

Next, a method of manufacturing a member for a semiconductor manufacturing apparatus according to one embodiment is described.

A method of manufacturing the member 100 for a semiconductor manufacturing apparatus includes: a mixing step of mixing raw material powders of the ceramic base material 1; a molding step of preparing, from a substrate raw material mixture obtained in the mixing step, a plurality of molded bodies; an arranging step of arranging a precursor of a conductor between the plurality of molded bodies; and a firing step of firing a laminate obtained in the arranging step.

C-1. Mixing Step

In the mixing step, a raw material of the ceramic material described above, and a magnesium oxide raw material (hereinafter referred to as "MgO raw material") or a spinel raw material are mixed to prepare a substrate raw material mixture.

In one embodiment, the raw material of the ceramic material is an AlN raw material. The AlN raw material contains AlN as a main component. The AlN raw material may contain oxygen and carbon in addition to AlN.

The amount of oxygen in the AlN raw material is, for example, from 0.7 wt % to 0.9 wt %. The amount of carbon in the AlN raw material is, for example, from 200 ppm to 400 ppm.

The AlN raw material typically has a powdery form. The average particle diameter D50 of the AlN raw material is, for example, from 1.0 µm to 1.5 µm.

The MgO raw material contains MgO as a main component. The MgO raw material typically has a powdery form. The average particle diameter D50 of the MgO raw material is, for example, from 0.2 µm to 0.8 µm.

The addition amount of the MgO raw material or the spinel raw material is, for example, 0.01 part by weight or more, preferably 0.05 part by weight or more, still more preferably 0.1 part by weight or more with respect to 100 parts by weight of the AlN raw material. Meanwhile, the addition amount of the MgO raw material or the spinel raw material is, for example, 1.1 parts by weight or less, preferably 1.0 part by weight or less with respect to 100 parts by weight of the AlN raw material.

In the mixing step, a titanium oxide raw material (hereinafter referred to as "TiO$_2$ raw material") is further mixed into the substrate raw material mixture described above as required.

The TiO$_2$ raw material contains TiO$_2$ as a main component. The TiO$_2$ raw material typically has a powdery form. The average particle diameter D50 of the TiO$_2$ raw material is, for example, from 0.1 µm to 0.5 µm.

The addition amount of the TiO$_2$ raw material is, for example, 0.1 part by weight or more, preferably 0.3 part by weight or more with respect to 100 parts by weight of the AlN raw material. Meanwhile, the addition amount of the TiO$_2$ raw material is, for example, 1.0 part by weight or less with respect to 100 parts by weight of the AlN raw material.

In one embodiment, in the mixing step, a binder is added to the substrate raw material mixture described above.

Examples of the binder include a polyvinyl acetal-based resin, a cellulose ether-based resin, a (meth)acrylic resin, and a paraffin wax. The (meth)acrylic resin includes an acrylic resin and/or a methacrylic resin. The binders may be used alone or in combination thereof.

Of such binders, a (meth)acrylic resin is preferred.

Any appropriate mixing device may be used in the mixing step. Examples of the mixing device include a ball mill, a bead mill, a vibration mill, a rocking mixer, a blender, and a homogenizer.

A mixing method may be dry mixing or wet mixing. In one embodiment, the wet mixing is performed in the mixing step. Any appropriate organic solvent is used in the wet mixing.

Examples of the organic solvent include alcohols, esters, and hydrocarbons. The organic solvents may be used alone or in combination thereof. Of the organic solvents, alcohols are preferred.

Examples of the alcohols include ethyl alcohol, isopropyl alcohol, ethyl cellosolve, butyl carbitol, and hexyl carbitol. Of those, isopropyl alcohol is preferred.

Environmental conditions in the mixing step are not particularly limited. The mixing step is typically performed under normal temperature (23° C.) and normal pressure (0.1 MPa).

A mixing time is freely and appropriately set. The mixing time is, for example, from 1 hour to 24 hours.

In the manner described above, a substrate raw material mixture is prepared. When the mixing step is dry mixing, the substrate raw material mixture has a powdery form. When the mixing step is wet mixing, the substrate raw material mixture has a slurry form.

C-2. Granulation Step

In one embodiment, the method of manufacturing the member 100 for a semiconductor manufacturing apparatus includes a granulation step after the mixing step and before the molding step.

In the granulation step, the substrate raw material mixture obtained in the mixing step is granulated by any appropriate granulation method. Examples of the granulation method include spray granulation and tumbling granulation. Of those, spray granulation is preferred.

Thus, a granulated product of the substrate raw material mixture (hereinafter referred to as "raw material granules") is prepared.

C-3. Molding Step

Then, in the molding step, the substrate raw material mixture (preferably raw material granules) is molded into a desired shape by any appropriate molding method to prepare a plurality of molded bodies.

Examples of the molding method include press molding, sheet molding, and cold isostatic pressing (CIP), and doctor blade molding. Of those, press molding is preferred. A pressure in the press molding is, for example, from 10 kgf/cm$^2$ to 500 kgf/cm$^2$.

Thus, a plurality of molded bodies each having a desired shape are prepared. In one embodiment, two molded bodies each having a disc shape are prepared.

C-4. Arranging Step

In the arranging step, a precursor of the conductor 2 is typically arranged between the two molded bodies to prepare a laminate. In the following description, among the two molded bodies, one molded body and the other molded body may be distinguished from each other by being referred to as "first molded body" and "second molded body," respectively.

In one embodiment, the precursor of the conductor 2 is formed on a sheet material by printing. When the precursor of the conductor 2 is formed by printing, first, a raw material of the conductive material described above is added to and mixed into an organic solvent to prepare a conductor raw material slurry. In this case, the raw material of the conductive material described above is preferably, for example, a WC raw material or a TiN raw material.

The WC raw material contains WC as a main component. The WC raw material typically has a powdery form. The average particle diameter D50 of the WC raw material is, for example, from 0.1 µm to 5.0 µm.

The TiN raw material contains TiN as a main component. The TiN raw material typically has a powdery form. The average particle diameter D50 of the TiN raw material is, for example, from 0.1 µm to 5.0 µm.

The addition amount of the TiN raw material is, for example, 0.5 part by weight or more, preferably 1.0 part by weight or more, more preferably 3.0 parts by weight or more with respect to 100 parts by weight of the WC raw material. Meanwhile, the addition amount of the TiN raw material is, for example, 20.0 parts by weight or less, preferably 10.0 parts by weight or less, more preferably 5.0 parts by weight or less with respect to 100 parts by weight of the WC raw material.

Examples of the organic solvent include the same organic solvents as those used in the mixing step described above. Of those, alcohols are preferred.

In addition, a binder is mixed into the conductor raw material slurry as required.

Examples of the binder include the same binders as those used in the mixing step described above. Of those, a (meth)acrylic resin is preferred.

The preparation of such conductor raw material slurry is typically performed with using any appropriate mixing device. Examples of the mixing device include the same mixing devices as in the mixing step described above.

In addition, environmental conditions in the preparation of the conductor raw material slurry are not particularly limited. The preparation of the conductor raw material slurry is typically performed under normal temperature (25° C.) and normal pressure (0.1 MPa).

Thus, the conductor raw material slurry is prepared. The conductor raw material slurry typically contains a WC raw material and a TiN raw material.

Then, the conductor raw material slurry is printed on a sheet material by any appropriate printing method.

Examples of the printing method include screen printing, letterpress printing, offset printing, and gravure printing. Of those, screen printing is preferred.

The sheet material has any appropriate configuration capable of holding a precursor of the conductor 2. Examples of the sheet material include a gel sheet, a ceramic sheet, and an acrylic sheet.

Of the sheet materials, a ceramic sheet is preferred.

Examples of a material for forming the ceramic sheet include the same materials as those for forming the ceramic base material 1 described above. Of those, the ceramic material described above is preferred, and aluminum nitride (AlN) is more preferred.

The thickness of the sheet material is, for example, from 50 μm to 1,000 μm, preferably from 100 μm to 500 μm.

Then, the printed conductor raw material slurry is typically dried in the atmosphere.

Thus, the precursor of the conductor 2 having a desired shape is formed on the sheet material to prepare a precursor holding sheet. The precursor holding sheet includes the sheet material and the precursor of the conductor 2 formed on the sheet material.

The thickness of the precursor of the conductor 2 is, for example, from 10 μm to 100 μm, preferably from 20 μm to 80 μm.

Then, the precursor holding sheet is arranged on the first molded body so that the ceramic sheet may be brought into contact with the first molded body.

In addition, the conductor raw material slurry may be directly printed on the first molded body to prepare the precursor of the conductor 2.

In addition, a method of preparing the precursor of the conductor 2 is not limited to the printing. For example, the precursor of the conductor 2 having a desired shape may be prepared by any appropriate method in advance and arranged on the first molded body. In one embodiment, the precursor of the conductor 2 having a desired shape is prepared from a transition metal (preferably Mo) by any appropriate method, and is arranged on the first molded body.

In addition, a liquid containing the MgO raw material and/or the spinel raw material may be applied to a surface of the precursor of the conductor 2 prepared in advance by any appropriate method.

Further, a thin film containing the MgO raw material and/or the spinel raw material may be formed on the surface of the precursor of the conductor 2. As a method of forming the thin film, there are given, for example, transfer, powder molding, and sputtering.

Thus, the precursor of the conductor 2 arranged on the first molded body is sandwiched between the first molded body and the second molded body. More specifically, the second molded body is arranged on the side of the precursor of the conductor 2 opposite to the first molded body.

Thus, a laminate having the structure "first molded body/precursor of conductor/second molded body" is prepared.

C-5. Firing Step

Then, in the firing step, the laminate is typically fired under a vacuum or a non-oxidizing atmosphere. More specifically, the temperature is increased from normal temperature (23° C.) to a predetermined firing temperature, and the firing temperature is then maintained for a predetermined firing time. A debinding step may be provided as required before the firing step.

The firing temperature is, for example, from 1,600° C. to 1,900° C., preferably from 1,650° C. to 1,850° C.

The firing time is, for example, from 0.5 hour to 100 hours.

An ambient pressure in the firing step is, for example, from 100 kPa to 900 kPa.

Examples of the firing method include hot pressing and hot isostatic pressing (HIP). Of those, hot pressing is preferred.

In the hot pressing, the laminate is typically arranged in a hot pressing die (e.g., a carbon jig), heated to the firing temperature as described above, and pressed under a predetermined pressure. A pressure in the hot pressing is, for example, from 5 MPa to 50 MPa.

In such firing step, the first molded body and the second molded body are integrated with each other by sintering, and the precursor of the conductor is converted into a conductor to be embedded in the ceramic base material. More specifically, the ceramic material (typically AlN) in each molded body is sintered, and Mg reacts with AlN as required to form spinel. Thus, the ceramic base material is prepared. In addition, in the firing step, the precursor of the conductor is fired in a state of being sandwiched between the two molded bodies, and hence atoms inside the molded body can be smoothly moved (diffused), and spinel can be concentrated more at an interface between the ceramic base material and the precursor of the conductor as compared to a case where the precursor of the conductor is fired in a state of being sandwiched between two sintered bodies. Thus, a conductor including a surface layer containing spinel and a skeleton positioned inside the surface layer can be stably formed from the precursor of the conductor. In particular, when the precursor of the conductor is held on the sheet material, the surface layer containing spinel can be still more stably formed.

When the precursor of the conductor is formed by printing, the conductor 2 is the conductor 2 obtained by printing (printed conductor).

In the manner described above, the member 100 for a semiconductor manufacturing apparatus including the ceramic base material and the conductor is prepared.

D. Application of Member for Semiconductor Manufacturing Apparatus

The member 100 for a semiconductor manufacturing apparatus is applied to any appropriate semiconductor manufacturing apparatus. Examples of the application of the member 100 for a semiconductor manufacturing apparatus include a heater, a susceptor, an electrostatic chuck, a ceramic conductor, a feed terminal, and a showerhead.

In one embodiment, the member 100 for a semiconductor manufacturing apparatus is applied to a heater 101. When the member 100 for a semiconductor manufacturing apparatus is applied to the heater 101, the ceramic base material 1 functions as a substrate mounting plate, and the conductor 2 includes the resistance heating element 2a. In the illustrated example, the conductor 2 further includes the ESC electrode 2b in addition to the resistance heating element 2a.

The heater 101 is a heater for a semiconductor manufacturing apparatus, and includes: the member 100 for a semiconductor manufacturing apparatus (the ceramic base material 1 and the conductor 2); a ceramic shaft 5; a first power feeding rod 6; and a second power feeding rod 7.

The ceramic base material (substrate mounting plate) 1 may be supported by the ceramic shaft 5. The ceramic shaft 5 is connected to the surface of the ceramic base material on the side opposite to the mounting surface 1a.

The ceramic shaft 5 has any appropriate shape. In one embodiment, the ceramic shaft 5 has a cylindrical shape extending in the thickness direction of the ceramic base material 1. In the illustrated example, the axial line of the ceramic shaft 5 and the center of the ceramic base material 1 substantially coincide with each other as viewed in the thickness direction of the ceramic base material 1.

The ceramic shaft 5 is formed of any appropriate ceramic material. A ceramic material for forming the ceramic shaft 5 is preferably the same as the ceramic material in the ceramic base material 1. When the ceramic shaft and the ceramic base material contain the same ceramic material, a difference in thermal expansion between the ceramic base material and the ceramic shaft can be reduced, and hence bonding strength between the ceramic base material and the ceramic shaft under a high temperature environment can be sufficiently secured.

The first power feeding rod 6 is electrically connected to the resistance heating element 2a. In the illustrated example, the first power feeding rod 6 is electrically connected to the resistance heating element 2a through an internal space of the ceramic shaft 5. The first power feeding rod 6 is formed of any appropriate conductive material. A voltage may be applied to the resistance heating element 2a via the first power feeding rod 6.

The second power feeding rod 7 is electrically connected to the ESC electrode 2b. In the illustrated example, the second power feeding rod 7 is electrically connected to the ESC electrode 2b through an internal space of the ceramic shaft 5. The second power feeding rod 7 is formed of any appropriate conductive material. A voltage may be applied to the ESC electrode 2b via the second power feeding rod 7.

Figure 2:
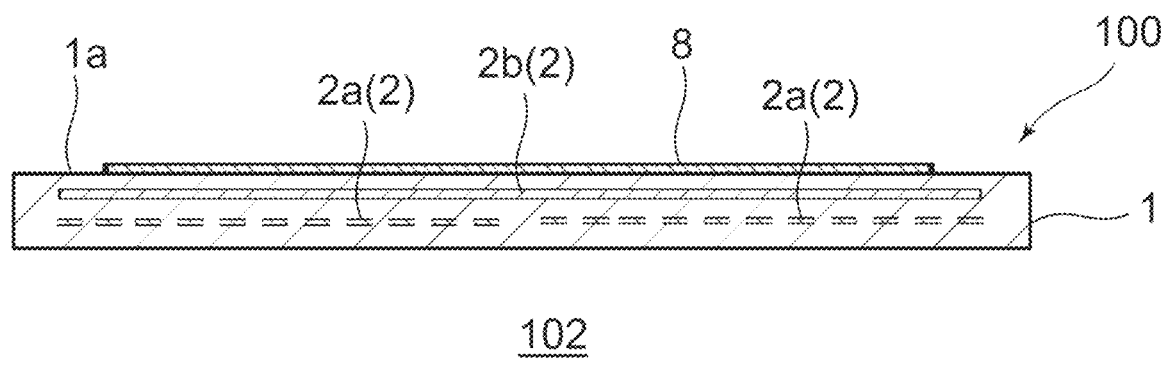
FIG. 2 is a schematic cross-sectional view of an electrostatic chuck according to another embodiment of the present disclosure.

As illustrated in FIG. 2, in another embodiment, the member 100 for a semiconductor manufacturing apparatus is applied to an electrostatic chuck 102. When the member 100 for a semiconductor manufacturing apparatus is applied to the electrostatic chuck 102, the ceramic base material 1 functions as a substrate mounting plate, and the conductor 2 includes the ESC electrode 2b. In the illustrated example, the conductor 2 further includes the resistance heating element 2a in addition to the ESC electrode 2b.

Figure 5:
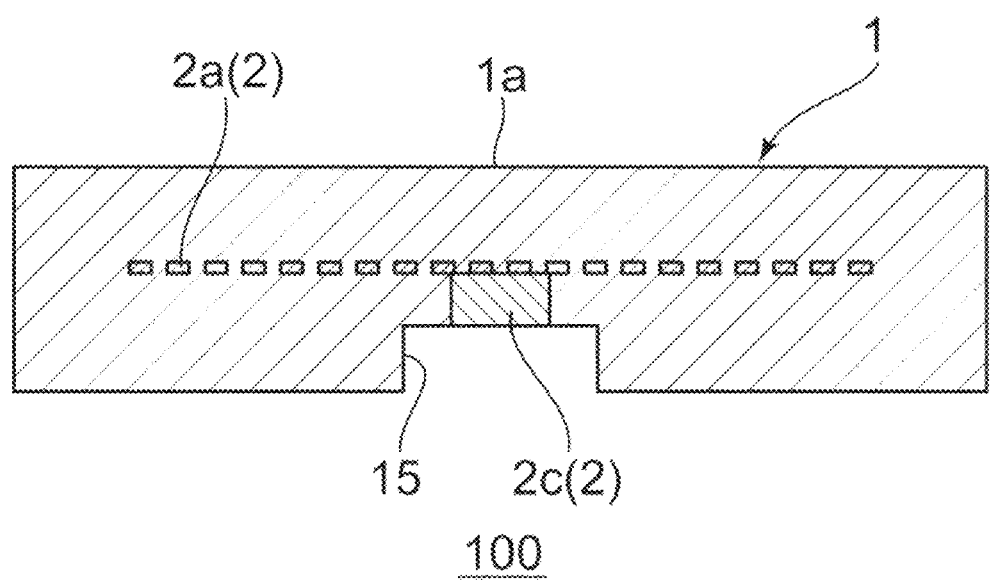
FIG. 5 is a schematic cross-sectional view of a member for a semiconductor manufacturing apparatus according to still another embodiment of the present disclosure.

As illustrated in FIG. 5, in one embodiment, the member 100 for a semiconductor manufacturing apparatus includes, as the conductor, the electrode and/or the resistance heating element described above, and a terminal portion 2c. The terminal portion 2c is electrically connected to the electrode and/or the resistance heating element. More specifically, the terminal portion 2c is embedded in the ceramic base material 1, and brought into contact with the electrode and/or the resistance heating element in the thickness direction of the ceramic base material 1. The terminal portion 2c may be bonded to the electrode and/or the resistance heating element. In the illustrated example, the member 100 for a semiconductor manufacturing apparatus includes the resistance heating element 2a described above, and the terminal portion 2c.

Part of a surface of the terminal portion 2c is typically exposed from the ceramic base material 1. In the illustrated example, the ceramic base material 1 includes a recessed portion 15. The recessed portion 15 is recessed from a surface of the ceramic base material 1 on the side opposite to the mounting surface 1a toward the terminal portion 2c. Part of the surface of the terminal portion 2c is exposed in the recessed portion 15. Thus, a voltage can be smoothly applied to a terminal from an external power source, and, as a result, the voltage can be stably applied to the electrode and/or the resistance heating element.

In the following description, a portion that is exposed from the ceramic base material 1 in the surface of the terminal portion 2c is sometimes referred to as "exposed portion."

As described above, the terminal portion 2c includes the surface layer 21 containing spinel and the skeleton 22 containing a conductive material. The surface layer 21 of the terminal portion 2c is positioned on at least part of an interface between the skeleton 22 and the ceramic base material 1. The surface layer 21 of the terminal portion 2c is typically free of being arranged on the exposed portion in the surface of the terminal portion 2c.

The skeleton 22 of the terminal portion 2c is preferably formed of WC and TiN. When the skeleton contains WC and TiN, a fracture due to a difference between the thermal expansion coefficients of the terminal portion and the ceramic base material can be suppressed.

In addition, when the skeleton 22 of the terminal portion 2c contains WC and TiN, and when the skeleton 22 of the conductor 2 (the electrode and/or the resistance heating element) to be electrically connected to the terminal portion 2c contains WC and TiN, the terminal portion 2c and the conductor 2 can be stably bonded to each other, and hence peeling between the members can be stably suppressed.

The thickness of the terminal portion 2c is, for example, from 0.50 mm to 8.00 mm, preferably from 1.00 mm to 4.00 mm, more preferably from 1.20 mm to 2.00 mm.

The terminal portion 2c has any appropriate shape. In the illustrated example, the terminal portion 2c has a flat sheet shape.

Figure 6A:
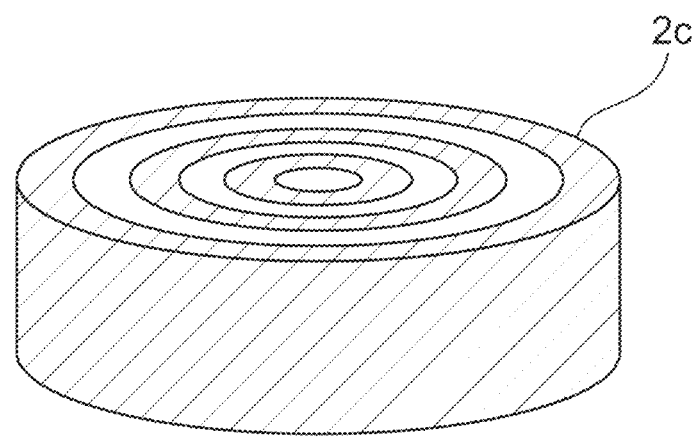
FIG. 6A is a schematic perspective view of an example of a terminal portion in the member for a semiconductor manufacturing apparatus of FIG. 5.
Figure 6B:
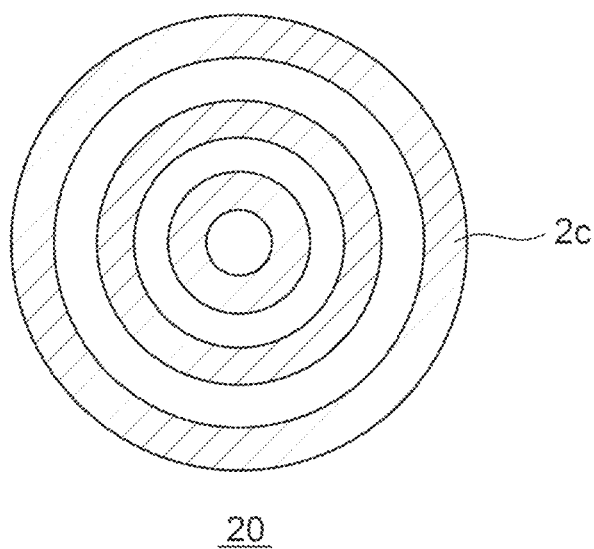
FIG. 6B is a schematic plan view of the terminal portion of FIG. 6A.

As illustrated in FIG. 6A and FIG. 6B, the terminal portion 2c may be formed of a plurality of tubular members arranged concentrically. The same ceramic material as the ceramic base material 1 is typically arranged between the plurality of tubular members.

Figure 7A:
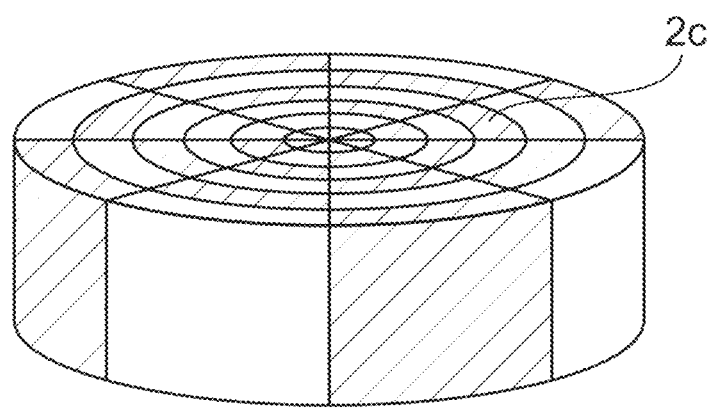
FIG. 7A is a schematic perspective view of a modification example of the terminal portion in the member for a semiconductor manufacturing apparatus of FIG. 5.
Figure 7B:
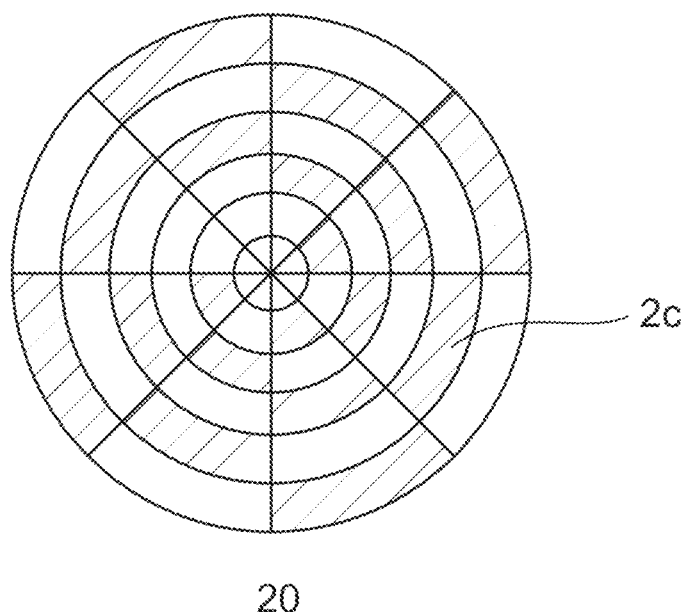
FIG. 7B is a schematic plan view of the terminal portion of FIG. 7A.

As illustrated in FIG. 7A and FIG. 7B, the terminal portion 2c may be formed of a plurality of small piece members arranged in a staggered shape. The same ceramic material as the ceramic base material 1 is typically arranged between the plurality of small piece members.

Figure 8A:
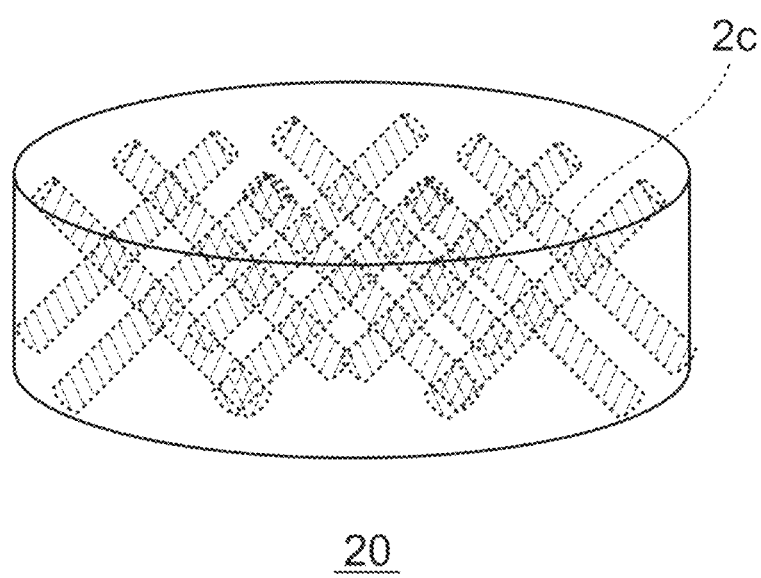
FIG. 8A is a schematic perspective view of another modification example of the terminal portion in the member for a semiconductor manufacturing apparatus of FIG. 5.
Figure 8B:
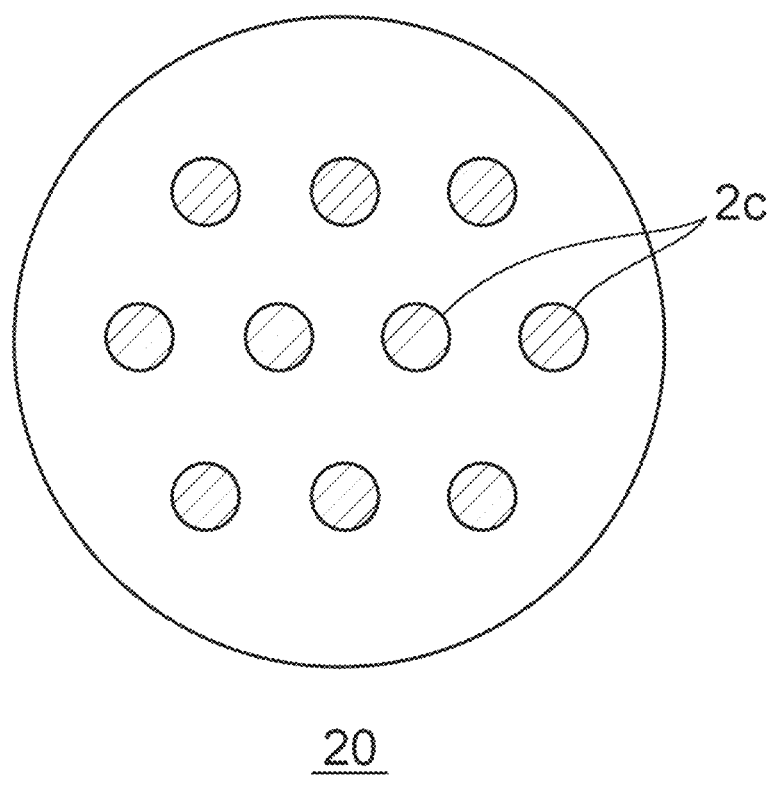
FIG. 8B is a schematic plan view of the terminal portion of FIG. 8A.

As illustrated in FIG. 8A and FIG. 8B, the terminal portion 2c may be formed of a plurality of rod-shaped members arranged at a distance from each other. The same ceramic material as the ceramic base material 1 is typically arranged between the plurality of rod-shaped members.

In the terminal portion 2c as illustrated in FIG. 6A to FIG. 8B, the same ceramic material as the ceramic base material 1 is arranged in the vicinity of the various members for forming the terminal portion 2c. Accordingly, in the member 100 for a semiconductor manufacturing apparatus including such terminal portion 2c, a crack or a residual stress due to a difference in thermal expansion can be reduced.

In order to manufacture the member 100 for a semiconductor manufacturing apparatus including the terminal portion 2c illustrated in FIG. 6A to FIG. 8B, for example, a tablet 20 in accordance with the configuration of the terminal portion is prepared by using the substrate raw material mixture described above and the raw material of the conductive material described above. As a preparation device for a tablet, there is typically given a 3D printer.

Then, in the arranging step described above, the tablet 20 is arranged between the first molded body and the second molded body as the precursor of the conductor. Thus, a laminate having the structure "first molded body/tablet/second molded body" is prepared.

After that, the laminate is fired through the firing step described above. That is, the molded body and the tablet are simultaneously fired. At this time, the molded body and the tablet each contain the substrate raw material mixture, and hence a difference in shrinkage ratio therebetween can be reduced. Accordingly, in the member for a semiconductor manufacturing apparatus to be manufactured, the occurrence of a crack can be suppressed, and a residual stress can be reduced.

In the manner described above, the member 100 for a semiconductor manufacturing apparatus including the terminal portion 2c is manufactured.

EXAMPLES

The present disclosure is specifically described below by way of Examples and Comparative Examples. However, the present disclosure is by no means limited by these Examples. Measurement methods for characteristics are as described below.

(1) Identification of Elemental Composition of Conductor with EPMA

Heaters for semiconductor manufacturing apparatus manufactured in Examples and Comparative Example were each cut into a test piece measuring 10 mm×10 mm. The thickness of the test piece was 3 mm.

The cross section along the thickness direction of a ceramic base material in the test piece was mirror polished to serve as a measurement surface by lapping. The measurement surface included a conductor.

Then, the polished surface was analyzed with an EPMA, and an elemental mapping image was obtained. Thus, the elemental compositions of the surface layer and skeleton of the conductor were identified. In Comparative Example 1, the conductor was free of a surface layer. The results are shown in Table 1.

(2) Measurement of Mg Intensity with EPMA

A test piece was prepared in the same manner as in the above-mentioned section "(1) Identification of Elemental Composition of Conductor with EPMA."

Then, on a measurement surface of the test piece, three measurement lines extending along the thickness direction of the ceramic base material, the measurement lines passing through the conductor, were determined. Each of the three measurement lines had a first end on a mounting surface side and a second end on a side opposite to the first end. In addition, the three measurement lines were positioned at any appropriate distance from each other in a direction perpendicular to the thickness direction of the ceramic base material.

After that, each measurement line was subjected to line analysis with an EPMA under the following conditions, and an intensity of a characteristic X-ray of each of Mg and Al in each measurement line was measured.

Figure 3:
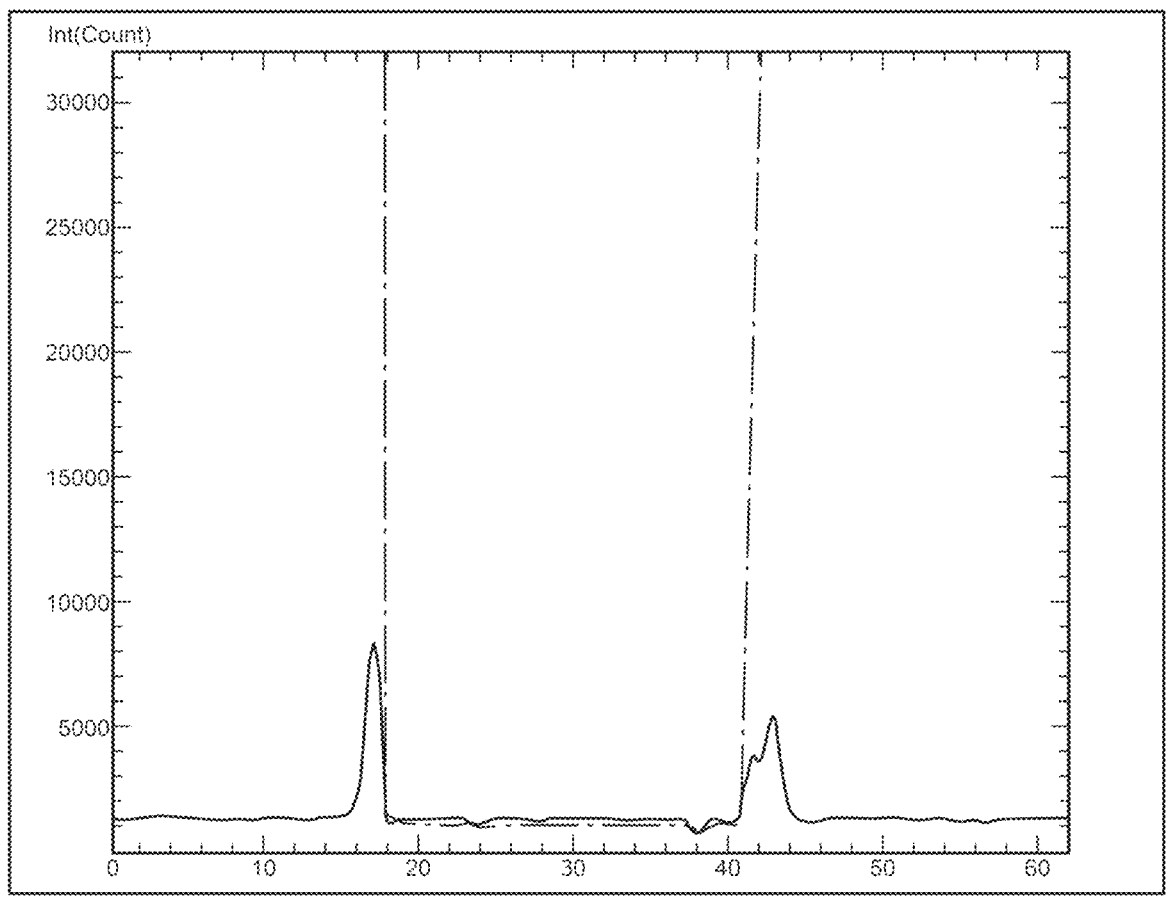
FIG. 3 is a Mg characteristic X-ray spectrum according to a heater for a semiconductor manufacturing apparatus of Example 1.
Figure 4:
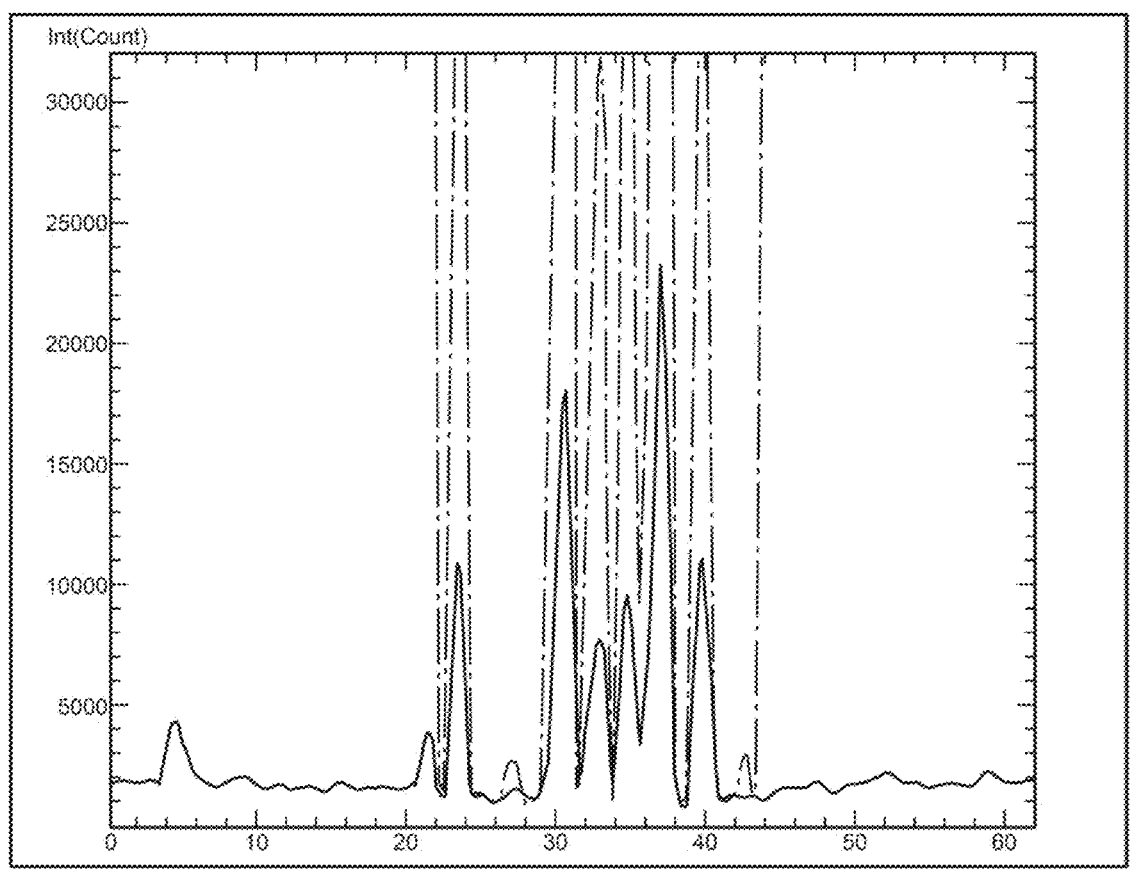
FIG. 4 is a Mg characteristic X-ray spectrum according to a heater for a semiconductor manufacturing apparatus of Comparative Example 1.

<Measurement Conditions>
Apparatus: JXA-8530FPlus, manufactured by JEOL Ltd.
Accelerating voltage: 15 kV
Probe current: $1\times10^{-7}$ A
Measurement magnification: 2,000 times The resultant intensity of the characteristic X-ray of Mg and a distance from the first end of each measurement line to the second end thereof are plotted on a Y-axis and an X-axis, respectively, to generate a Mg characteristic X-ray spectrum for each measurement line. A Mg characteristic X-ray spectrum in Example 1 is shown in FIG. 3, and a Mg characteristic X-ray spectrum in Comparative Example 1 is shown in FIG. 4. In each of FIG. 3 and FIG. 4, the Mg characteristic X-ray spectrum is indicated by a solid line, and an Al characteristic X-ray spectrum is indicated by a dash-dotted line.

Then, in the Mg characteristic X-ray spectrum for each measurement line, the maximum intensity of a peak positioned inside the conductor was defined as the Mg intensity of the conductor. An average value of the Mg intensities of the conductor was calculated from the Mg intensities of the conductor in the three measurement lines.

In addition, in the Mg characteristic X-ray spectrum for each measurement line, the maximum intensity of a peak positioned at an interface between the ceramic base material and the conductor (specifically, a first interface on a mounting surface side and a second interface on an opposite side) was defined as a Mg intensity in the surface layer. An average value of the Mg intensities in the surface layer was calculated from the Mg intensities in the surface layer in the three measurement lines.

In addition, such measurement of the Mg intensity with the EPMA was performed twice, and Mg intensities of cross sections different from each other of the ceramic base material having arranged therein the conductor were measured. The results thereof are shown in Table 2.

(3) Measurement of Resistivity of Conductor

A test piece having a rectangular parallelepiped shape including the conductor was cut out from the heaters for semiconductor manufacturing apparatus manufactured in Examples and Comparative Example. The length of each side of the test piece was 9 mm. The conductor was exposed on end surfaces of the test piece facing each other. The dimensions of the conductor in a cross section of the test piece were measured with an optical microscope, and a cross sectional area S ($cm^2$) of the conductor was calculated. The dimensions between the end surfaces on which the conductor was exposed were measured with a vernier caliper as a length L (cm) of the conductor.

Then, a lead wire was connected to the conductor exposed on each end surface of the test piece with a conductive paste. After that, a current in the range of from 0 mA to 150 mA was supplied to the conductor in the test piece under normal temperature (25° C.) and normal pressure (0.1 MPa), and a minute voltage value V (mV) that occurred at that time was measured. A resistance R ($\Omega$) of the conductor was calculated from a relationship between a current value I and the voltage value V. After that, a resistivity p ($\Omega$·cm) of the conductor was calculated based on the following equation (1). The results thereof are shown in Table 1.

$$\rho = R \times S/L \quad (1)$$

In the equation (1), $\rho$ represents the resistivity of the conductor, R represents the resistance of the conductor, S represents the cross sectional area of the conductor, and L represents the length of the conductor.

(4) Measurement of Resistivity Variation of Conductor

The resistivity of the conductor of each of the heaters for semiconductor manufacturing apparatus manufactured in Examples and Comparative Example was measured by four-terminal sensing. More specifically, a resistance value of each of a plurality of any appropriate sites (specifically four sites) in the same plane of the conductor was measured by four-terminal sensing. Then, the resistivities of the respective sites of the conductor were calculated from the measured resistance values of the respective sites of the conductor and the measurement results of the cross sectional area of the conductor. After that, a resistivity variation γ (%) of the conductor was calculated based on the following equation (2). The results thereof are shown in Table 1.

$$\gamma = (\alpha_{max} - \alpha_{min})/\beta \times 100 \quad (2)$$

In the equation (2), $\alpha_{max}$ represents the maximum resistivity of the resistivities of the respective sites of the conductor, $\alpha_{min}$ represents the minimum resistivity of the resistivities of the respective sites of the conductor, β represents the average value of the resistivities of the plurality of sites of the conductor, and γ represents the resistivity variation.

Example 1

98.5 Parts by weight of AlN raw material powder (average particle diameter D50: 1.2 μm, oxygen content: 0.8 wt %), 1.0 part by weight of MgO raw material powder (average particle diameter D50: 0.5 μm), and 0.5 part by weight of $TiO_2$ raw material powder (average particle diameter D50: 0.3 μm) were loaded into a ball mill. Further, an acrylic resin (binder) and isopropyl alcohol (IPA) were loaded into the ball mill, followed by wet mixing for 2 hours.

Then, the obtained base material raw material slurry was subjected to dry granulation with a spray granulation apparatus to provide raw material granules. The particle diameter of each of the raw material granules was 80 μm.

Then, the raw material granules were uniaxially pressed to provide a first molded body having a disc shape. A pressure in the uniaxial pressing was 100 kgf/cm$^2$. In addition, a second molded body having a disc shape was prepared in the same manner as in the first molded body.

In addition, 96.0 parts by weight of WC raw material powder, 4.0 parts by weight of TiN raw material powder, and an acrylic resin (binder) were loaded into a ball mill, followed by wet mixing with an organic solvent for 10 hours. Thus, a conductor raw material slurry was obtained.

After that, the conductor raw material slurry was applied onto a ceramic sheet serving as a sheet material in a predetermined pattern shape by screen printing, and then dried in the atmosphere at 70° C. for 30 minutes. Thus, a precursor holding sheet including the ceramic sheet and a precursor of a conductor formed on the ceramic sheet was prepared. The thickness of the precursor of the conductor was 50 μm. The ceramic sheet was formed of aluminum nitride. The thickness of the ceramic sheet was 200 μm.

Then, the precursor holding sheet was arranged on the first molded body so that the ceramic sheet was brought into contact with the first molded body.

Then, the second molded body was arranged on the side of the precursor of the conductor opposite to the first molded body. Thus, a laminate including the precursor holding sheet sandwiched between the first molded body and the second molded body was obtained.

Then, the above-mentioned laminate was fired by hot pressing. More specifically, the laminate was fired under a nitrogen atmosphere at 1,800° C. for 2 hours.

Thus, the first molded body and the second molded body were sintered to be integrated, and the precursor of the conductor was converted into a conductor by the firing to be embedded in the ceramic base material. At this time, atoms inside the molded body moved (diffused), and a surface layer containing spinel was formed at an interface between the molded body and the precursor of the conductor.

In the manner described above, a heater for a semiconductor manufacturing apparatus including the ceramic base material and the conductor was manufactured.

Example 2

A heater for a semiconductor manufacturing apparatus was manufactured in the same manner as in Example 1 except that the first molded body and the second molded body were changed to a first molded sheet and a second molded sheet prepared as described below, respectively.

Each of the first molded sheet and the second molded sheet was prepared by molding a base material raw material slurry prepared in the same manner as in Example 1 into a sheet shape with a doctor blade molding machine. The thickness of each of the first molded sheet and the second molded sheet was 200 μm.

Example 3

A first molded body and a second molded body were prepared in the same manner as in Example 1.

In addition, a coil formed of molybdenum (Mo) (hereinafter referred to as "Mo coil") was prepared. Then, the Mo coil was sandwiched between the first molded body and the second molded body to provide a laminate.

After that, the laminate was fired in the same manner as in Example 1. Thus, the first molded body and the second molded body were sintered to be integrated. In addition, a surface layer containing spinel was formed on the surface of the Mo coil, and a conductor including the surface layer and a skeleton was embedded in a ceramic base material.

In the manner described above, a heater for a semiconductor manufacturing apparatus including the ceramic base material and the conductor was manufactured.

Comparative Example 1

A first molded body and a second molded body were prepared in the same manner as in Example 1 except that, in the preparation of the conductor raw material slurry, 4.0 parts by weight of $Al_2O_3$ powder was used instead of 4.0 parts by weight of the TiN powder. Then, each of the first molded body and the second molded body was fired by hot pressing in advance. More specifically, each of the first molded body and the second molded body was fired under a nitrogen atmosphere at 1,800° C. for 2 hours. Thus, a first sintered body and a second sintered body were obtained.

After that, a conductor raw material slurry prepared in the same manner as in Example 1 was applied onto the first sintered body in a predetermined pattern shape by screen printing, and then dried in the atmosphere at 70° C. for 30 minutes. Thus, a precursor of a conductor was directly formed on the first sintered body.

Then, the second sintered body was arranged on the side of the precursor of the conductor opposite to the first sintered body. Thus, a laminate including the precursor of the conductor sandwiched between the first sintered body and the second sintered body was obtained.

Then, the laminate was fired in the same manner as in Example 1. Thus, a heater for a semiconductor manufacturing apparatus was manufactured.

TABLE 1

| No. | | Example 1 | Example 2 | Example 3 | Comparative Example 1 |
|---|---|---|---|---|---|
| Conductor Evaluation | Surface layer | Spinel | Spinel | Spinel | — |
| | Skeleton | WC, TiN | WC, TiN | Mo | WC, Spinel |
| | Resistivity [Ω·cm] | $2.0 \times 10^{-5}$ | — | $5.6 \times 10^{-5}$ | $3.3 \times 10^{-5}$ |
| | Resistivity variation [%] | Less than 1.0 | — | Less than 1.0 | 3.0 |

TABLE 2

| No. | | | | Example 1 | | | | | |
|---|---|---|---|---|---|---|---|---|---|
| Measurement surface | | | | First cross section | | | Second cross section | | |
| Measurement line | | | | First | Second | Third | First | Second | Third |
| EPMA (line analysis) | Conductor | Skeleton | Mg intensity | 1,266 | 1,227 | 1,223 | 1,632 | 1,238 | 1,885 |
| | | | ave | | 1,239 | | | 1,585 | |
| | | Surface layer | First interface | Mg intensity | 14,607 | 6,149 | 3,677 | 11,986 | 10,894 | 27,941 |
| | | | | ave | | 8,144 | | | 16,940 | |
| | | | Second interface | Mg intensity | 5,644 | 3,132 | 4,945 | 5,186 | 6,135 | 8,473 |
| | | | | ave | | 4,574 | | | 6,598 | |

| No. | | | | Comparative Example 1 | | | | | |
|---|---|---|---|---|---|---|---|---|---|
| Measurement surface | | | | First cross section | | | Second cross section | | |
| Measurement line | | | | First | Second | Third | First | Second | Third |
| EPMA (line analysis) | Conductor | Skeleton | Mg intensity | 5,317 | 2,876 | 7,732 | 7,459 | 3,644 | 6,428 |
| | | | ave | | 5,308 | | | 5,844 | |
| | | Surface layer | First interface | Mg intensity | 5,186 | — | 5,610 | 13,512 | — | 16,770 |
| | | | | ave | | 5,398 | | | 15,141 | |
| | | | Second interface | Mg intensity | — | 14,416 | 11,849 | 3,902 | 3,288 | — |
| | | | | ave | | 13,133 | | | 3,595 | |

<Evaluation>

As shown in Table 1, in each of Examples 1 to 3, the conductor included a surface layer containing spinel and a skeleton, and in Comparative Example 1, the conductor is free of a surface layer, and hence spinel is dispersed in the entire conductor.

As described above, it is found that, when the conductor includes a surface layer, resistivity variation in the conductor can be significantly reduced. In the conductor, the resistivity variation and conductivity variation correlates with each other, and hence when the resistivity variation is small, the conductivity variation is also small. Accordingly, it is found that the uniformity of conductivity in the conductor is excellent.

In addition, as shown in Table 2, in Example 1, in the Mg characteristic X-ray spectrum, the maximum intensity of the peak positioned on the surface layer of the conductor (a first interface and a second interface) is larger than the maximum intensity of the peak positioned on the skeleton of the conductor. That is, it was recognized that a Mg concentration in the surface layer of the conductor (the first interface and the second interface) was larger than a Mg concentration in the skeleton of the conductor.

The member for a semiconductor manufacturing apparatus according to the embodiment of the present disclosure is typically used in semiconductor manufacturing, and in particular, can be suitably used in, for example, a susceptor, a heater, an electrostatic chuck, a ceramic conductor, a feed terminal, or a showerhead.

What is claimed is:

1. A member for a semiconductor manufacturing apparatus, comprising:
   a ceramic base material; and
   a conductor arranged in the ceramic base material,
   wherein the ceramic base material contains a ceramic material having a thermal expansion coefficient of from $2.0 \times 10^{-6}/°$C. to $10.0 \times 10^{-6}/°$C. and spinel, and
   wherein the conductor includes a surface layer containing spinel and a skeleton positioned inside the surface layer.

2. The member for a semiconductor manufacturing apparatus according to claim 1, wherein the skeleton contains tungsten carbide and titanium nitride.

3. The member for a semiconductor manufacturing apparatus according to claim 2,
   wherein a content ratio of tungsten carbide in the skeleton is from 50 wt % to 99 wt %, and
   wherein a content ratio of titanium nitride in the skeleton is from 1 wt % to 50 wt %.

4. The member for a semiconductor manufacturing apparatus according to claim 1, wherein the skeleton contains molybdenum.

5. The member for a semiconductor manufacturing apparatus according to claim 1, wherein, in line analysis with an electron probe microanalyzer in a cross section, which is obtained by cutting the ceramic base material having arranged therein the conductor in a thickness direction, an average value of Mg intensities in the surface layer is 3 times or more as large as an average value of Mg intensities in the skeleton.

6. The member for a semiconductor manufacturing apparatus according to claim 1, wherein the ceramic base material further contains titanium nitride.

7. The member for a semiconductor manufacturing apparatus according to claim 6,
wherein a content ratio of spinel in the ceramic base material is from 0.5 wt % to 55 wt %, and
wherein a content ratio of titanium nitride in the ceramic base material is from 0.1 wt % to 1.0 wt %.

8. The member for a semiconductor manufacturing apparatus according to claim 1, wherein a dimension of the conductor in a thickness direction of the ceramic base material is from 10 μm to 50 μm.

9. The member for a semiconductor manufacturing apparatus according to claim 1, wherein the conductor is a conductor obtained by printing.

10. The member for a semiconductor manufacturing apparatus according to claim 1, wherein the member for a semiconductor manufacturing apparatus comprises, as the conductor:
an electrode and/or a resistance heating element; and
a terminal portion electrically connected to the electrode and/or the resistance heating element.

* * * * *